United States Patent
Roza

(10) Patent No.: US 7,212,136 B2
(45) Date of Patent: May 1, 2007

(54) RECURSIVE BIT-STREAM CONVERTER AND A METHOD FOR RECURSIVE BIT-STREAM CONVERSION

(75) Inventor: Engel Roza, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 10/555,841

(22) PCT Filed: May 5, 2004

(86) PCT No.: PCT/IB2004/050598

§ 371 (c)(1),
(2), (4) Date: Nov. 3, 2005

(87) PCT Pub. No.: WO2004/100383

PCT Pub. Date: Nov. 18, 2004

(65) Prior Publication Data

US 2006/0290540 A1    Dec. 28, 2006

(30) Foreign Application Priority Data

May 8, 2003 (EP) .................................. 03101267

(51) Int. Cl.
*H03M 7/30* (2006.01)

(52) U.S. Cl. ........................................ 341/76; 341/101

(58) Field of Classification Search ................ 341/143, 341/200, 101, 100, 76, 50
See application file for complete search history.

(56) References Cited

U.S. PATENT DOCUMENTS

| 5,546,477 A * | 8/1996 | Knowles et al. ............ 382/242 |
| 5,661,822 A * | 8/1997 | Knowles et al. ............ 382/233 |
| 2004/0052310 A1 * | 3/2004 | Noguchi et al. ............ 375/243 |

* cited by examiner

Primary Examiner—Peguy JeanPierre

(57) ABSTRACT

A Recursive bit-stream converter (Rebic) having digital low pass filter and multi-bit quantizer means in a feedback arrangement and means to serialize digital words obtain a non-integer Rebic factor via at least two quantizers that are successively operative to serialize their digital words to the output of the converter.

4 Claims, 3 Drawing Sheets

Figure 1:
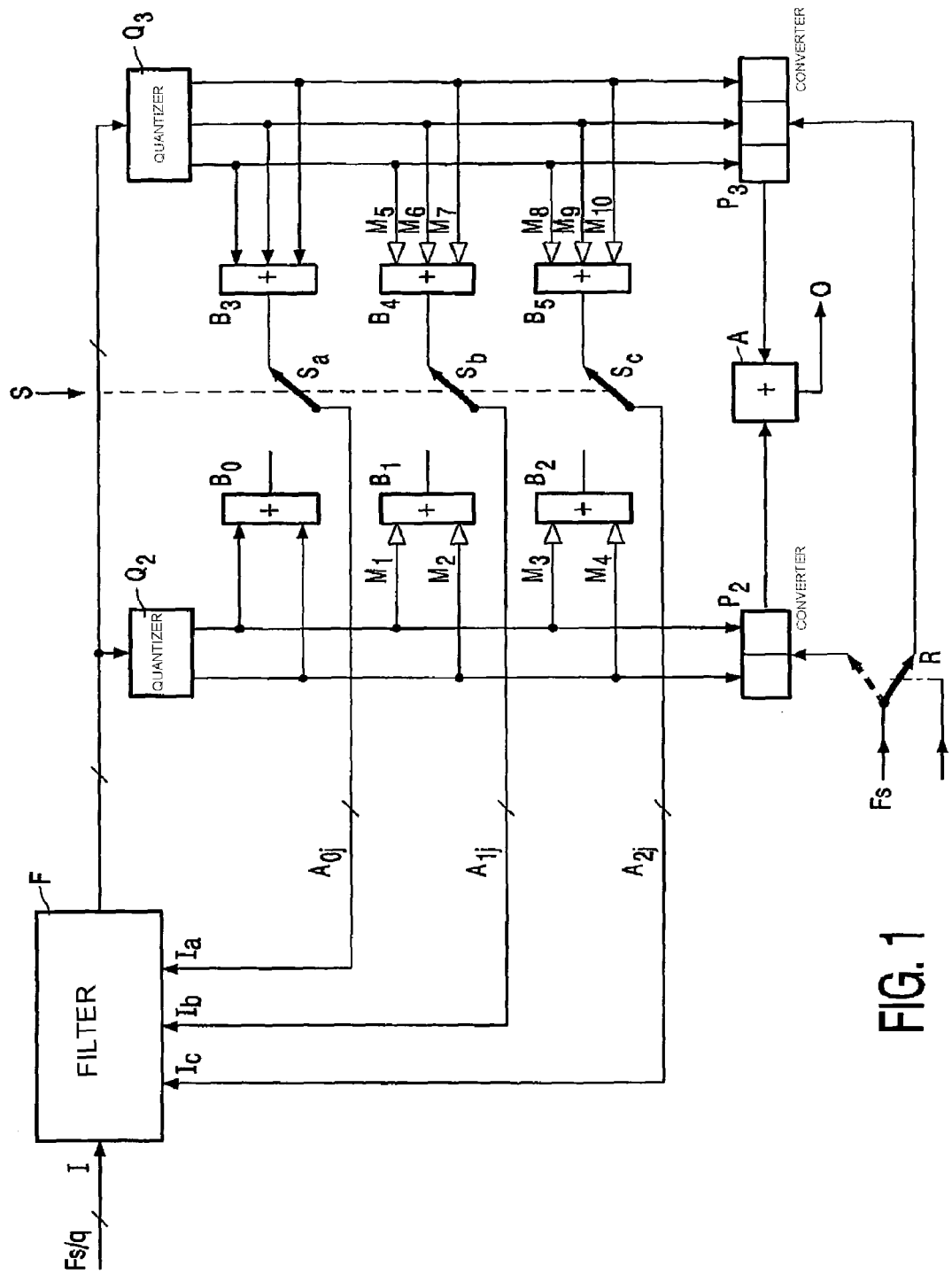

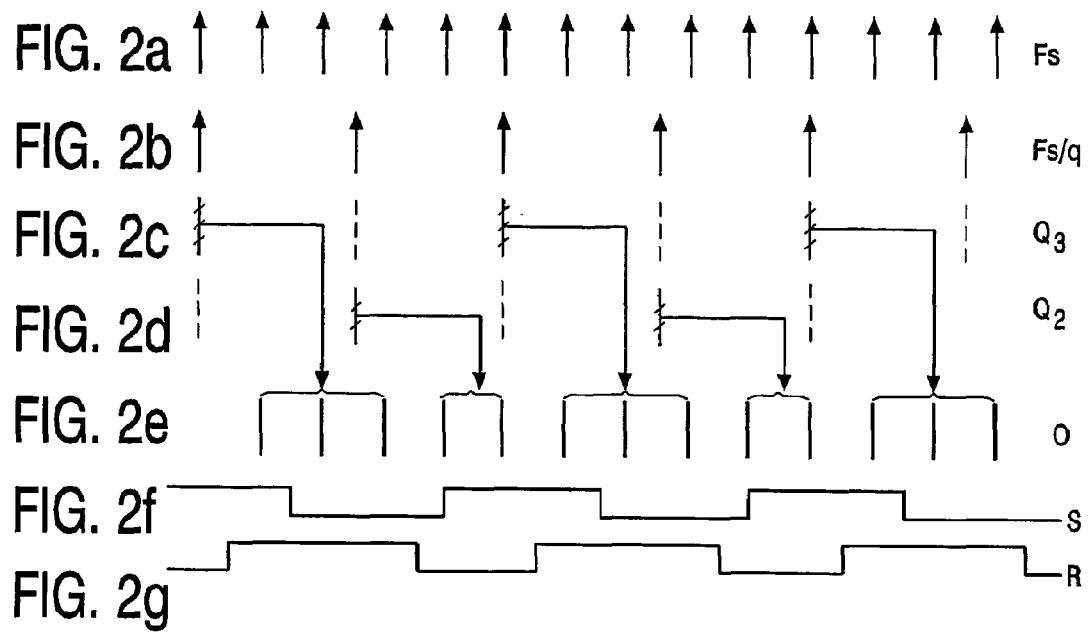
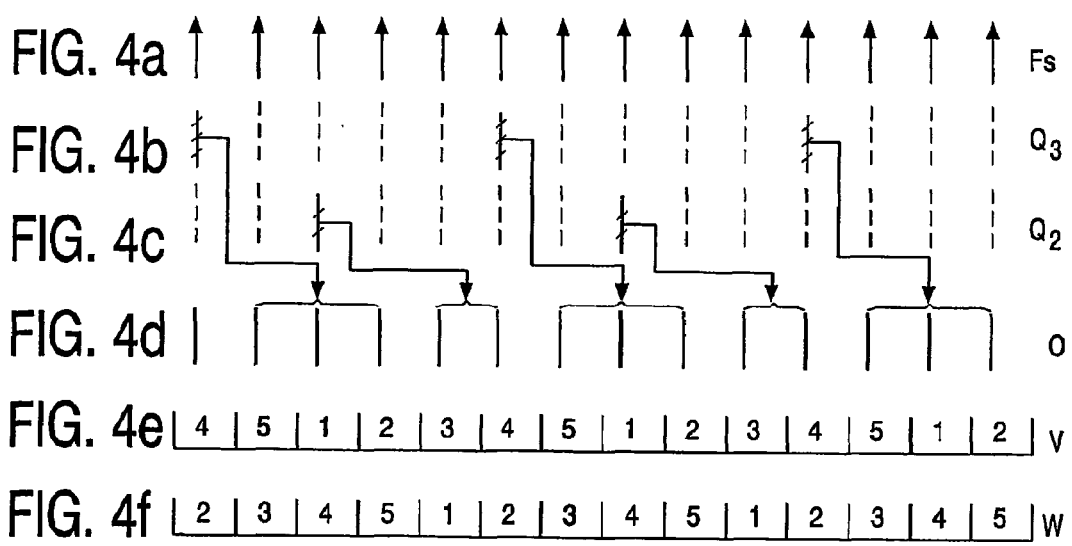

RECURSIVE BIT-STREAM CONVERTER AND A METHOD FOR RECURSIVE BIT-STREAM CONVERSION

The invention relates to a recursive bit-stream converter for converting a multi-bit digital input signal to a single bit digital output signal, said converter comprising, in a feedback loop, means for low pass filtering said input signal and producing digital filtered words, quantizer means for quantizing said filtered words and means for applying the quantized filtered words through feedback means to the low pass filtering means and further comprising outside of said feedback loop means for parallel to series conversion of the quantized filtered words to produce the single bit digital output signal.

The invention further relates to a method for converting a multi-bit digital input signal to a single bit digital output signal in which said input signal is low pass filtered by low filter means to digital filtered words which are quantized by quantizer means and the fed back to the low pass filter means, in which method the quantized filtered words are converted by parallel to series conversion means to the single bit digital output signal An example of such a recursive bit-stream converter is described in applicants' prior European patent application 01203770.1 (PHNL010676).

A recursive bit-stream converter (Rebic) is a generalized digital implementation of a conventional single-bit sigma-delta modulator in which a high precision multi-bit signal is converted into a 1-bit digital signal (bit-stream). The main purpose of the single-bit sigma-delta modulator is to reduce the number of bits without substantially reducing the signal to noise ratio. Whereas a single-bit sigma delta modulator comprises a loop filter that operates at the clock rate of the bit-stream and has a single bit quantizer for delivering the output signal at the same sample rate, Rebic is characterized by a quantizer that delivers digital words, each having a plurality of bits which may subsequently be serialized to obtain the single bit output signal. The number of bits contained in each such word is called the Rebic-factor q. The advantages of Rebic over conventional digital single-bit sigma delta modulation are: reduction of high speed circuitry, lower power consumption, less interference tones in the bit-stream and increased stability in high order configurations. All these properties are consequences of the multi-bit character of the signal in the inner modulation loop in spite of the 1-bit character of the output signal. The reason for higher stability is that the quantizer in the Rebic system has a multilevel nature. Therefore, the Rebic configuration is especially useful at higher values of the Rebic factor q. The higher the Rebic factor is i.e. the more levels are used in the quantizer, the more linear the behavior of the system is with the corresponding stability characteristics of a linear system.

There is however a penalty to be paid in using a Rebic configuration in stead of a sigma delta modulator: there is a slight deterioration of the signal to noise ratio that increases with the value of q. Consequently, in applications where a severe requirement on the signal-to-noise ratio exists, the recursive bit-stream converter is preferably used with substantially lower Rebic factor q. In this kind of applications the value of the Rebic factor is subject to a compromise: the higher the Rebic factor is, the more linear its behavior is, with lesser intermodulation and (in audio applications) lesser interference tones. On the other hand: the lower the Rebic factor is, the better the signal-to-noise ratio of the converter is.

However, because the Rebic factor q is the number of levels of the quantizer, this factor can only have integer values. A problem with the use of the Rebic configuration with a low q-factor is that the steps between two consecutive values of the Rebic factor become relatively large. Therefore it is inter alia an object of the present invention to provide a recursive bit-stream converter with a non-integer effective q-factor and the recursive bit-stream converter of the present invention is therefore characterized in that the quantizer means comprise at least two quantizers of different bits whose output words are successively parallel to series converted to produce the output signal and synchronously therewith successively applied to said feedback means.

In this connection it has to be noted that the expression "successively" does not only mean that in the output signal of the converter each serialized word of one of the quantizers is necessarily directly followed by a serialized word of another of the quantizers. It also includes that more than one serialized words originate from one quantizer before another quantizer becomes operative. It even includes that the respective quantizers are operated in a random sequence.

Because it is the object of the invention to provide a converter with a non-integer effective Rebic factor, the required circuitry is most simple if the converter is characterized in that the quantizer means comprise two quantizers and that the bit-number of one of these quantizers is one unity higher than the bit-number of the other of these quantizers. More particularly the invention may be characterized in that the recursive bit-stream converter is intended for use in coders for producing Super Audio CD signals and that the quantizer means comprise a 2-bit quantizer and a 3-bit quantizer, which are alternately operative in producing one serialized word in the output signal of the converter. The Rebic configuration is of interest for application in coders for Super Audio CD, because of its low amount of interference tones. There is in this application however a severe requirement for signal-to-noise, so that only a very minor sacrifice in signal-to-noise ratio as compared to conventional single-bit sigma delta modulation is allowed. It is found that a Rebic factor q=2 can fulfill the specification but that a factor q=3 shows a too low signal to noise ratio. Because of the relative big step between q=2 and q=3, a factor in between is of interest. When a 2-bit quantizer and a 3-bit quantizer alternate in delivering their bits to the output of the converter, a suitable Rebic factor q=2,5 is obtained. In case a still higher signal to noise ratio is preferred an effective factor q=1,5 may be chosen. In that case a 1-bit quantizer and a 2-bit quantizer should alternately operate to furnish the output bits.

A method described in the second paragraph according to the invention is characterized in that the quantizer means comprise at least two quantizers ($Q_2$, $Q_3$) of different bits whose output words are successively parallel to series converted by the parallel to series conversion means ($P_2$, $P_3$) to the output signal (O) and synchronously therewith successively fed back to the low pass filter means.

An advantage of the method according to the invention is that is possible to obtain a non-integer Rebic factor, thereby achieving an optimal trade-off between linearity, and thus stability, and signal to noise ratio.

Figure 3:
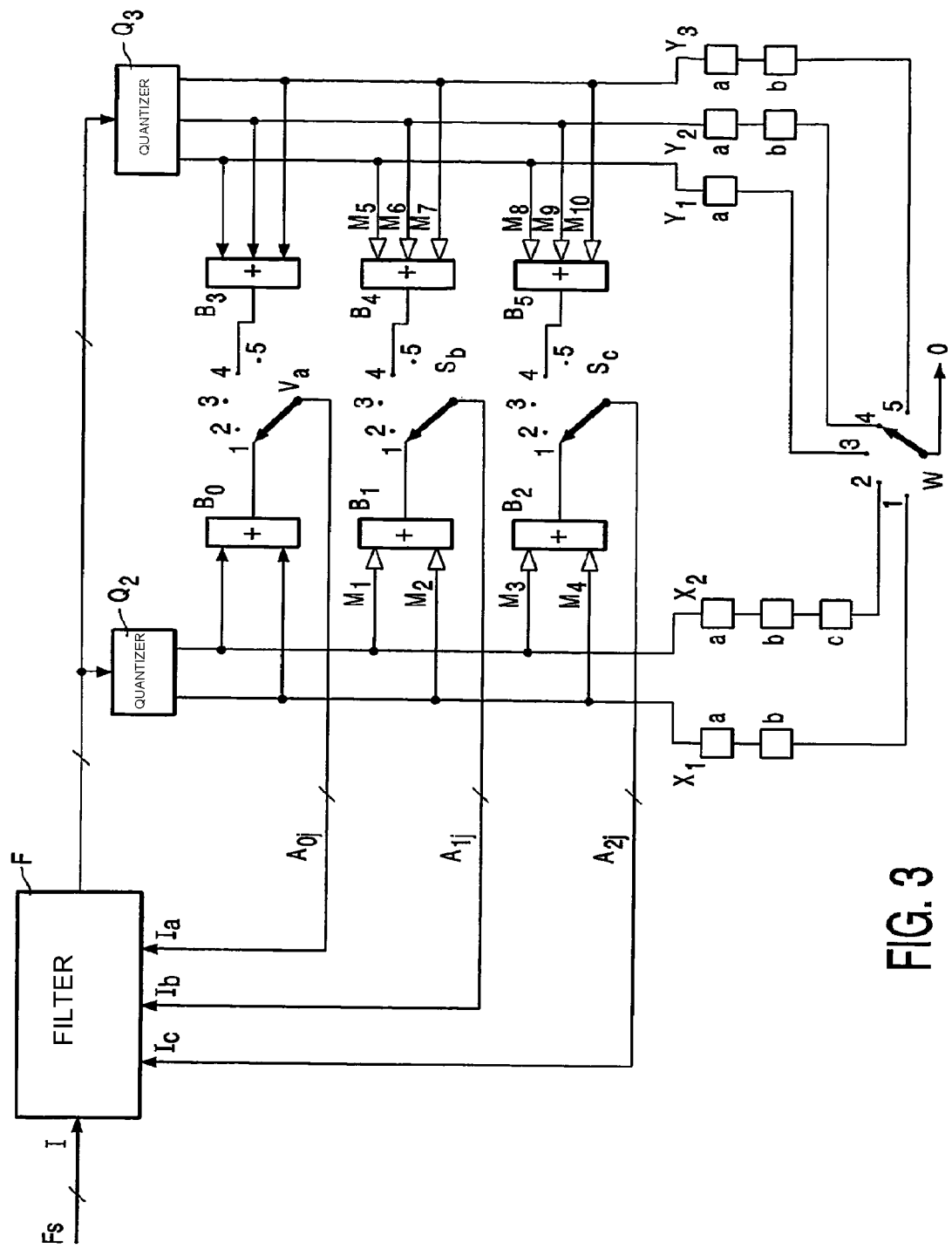

The invention will be described with reference to the accompanying figures. Herein shows:

FIG. 1 a first embodiment of a recursive bit-stream converter in accordance with the invention, FIG. 2 graphs for clarifying the operation of the recursive bit-stream converter of FIG. 1, FIG. 3 a second embodiment of a recursive bit-stream converter in accordance with the invention and FIG. 4 graphs for clarifying the operation of the recursive bit-stream converter of FIG. 3.

The recursive bit-stream converter of FIG. 1 comprises a digital low pass filter F. This filter receives at an input terminal I a multi-bit (e.g. 16 bit) high precision digital signal of sample rate $f_s/q$. This digital low pass filter may be similar to the low pass filter described and shown in applicant's European patent application 01203770.1 (PHNL010676) FIG. 2, which is incorporated herein by reference. The output words of the low pass filter F are applied to a 2-bit quantizer (mapper) $Q_2$ and to a 3-bit quantizer (mapper) $Q_3$. The two output bits of the quantizer $Q_2$ are applied to an adder $B_0$, through two multipliers $M_1$ and $M_2$ to an adder $B_1$ and, through two further multipliers $M_3$ and $M_4$ to an adder $B_2$. Similarly the three output bits of the quantizer $Q_3$ are applied to an adder $B_4$, through three multipliers $M_5$, $M_6$ and $M_7$ to an adder $B_4$ and through three further multipliers $M_8$, $M_9$ and $M_{10}$ to an adder $B_5$.

The arrangement of FIG. 1 further comprises a switch S having three sections $S_a$, $S_b$ and $S_c$ that are switched synchronously. The switch section $S_a$ alternately connects the outputs of the adders $B_0$ and $B_3$ to a feedback input $I_a$ of the filter F. The switch section $S_b$ alternately connects the outputs of the adders $B_1$ and $B_4$ to a feedback input $I_b$ and the switch section $S_c$ alternately connects the output of the adders $B_2$ and $B_5$ to a feedback input $I_c$ of the filter F. The three feedback signals are denoted by references $A_{0j}$, $A_{1j}$ and $A_{2j}$ respectively.

When the switch S is in the position as shown in FIG. 1, the 3-bit output of the quantizer $Q_3$ is fed back through the multipliers $M_5$-$M_{10}$ and the adders $B_3$, $B_4$, $B_5$ to the feedback inputs $I_a$, $I_b$ and $I_c$ of the filter F. The filter F, the quantizer $Q_3$ and the three feedback paths constitute a third order Rebic converter with Rebic factor q=3 of which only the output bits of the quantizer still have to be serialized. This is described in the abovementioned patent application wherein the feedback signals $A_{0j}$, $A_{1j}$ and $A_{2j}$ have the same meaning. In FIG. 1 the third order Rebic configuration is merely chosen for convenience of illustration. In practice a much higher order of e.g. 7 may be chosen to obtain a better noise shaping with a correspondingly higher signal to noise ratio.

When the position of the switch S is changed, the 2-bit output of the quantizer $Q_2$ is fed back through the multipliers $M_1$ to $M_4$ and the adders $B_0$ to $B_2$ to the three feedback inputs of the filter F. The filter F, the quantizer $Q_2$ and the three feedback paths now constitute a third order Rebic with q=2. The two output bits of the quantizer $Q_2$ are applied to a parallel-series converter $P_2$ and the three output bits of the quantizer $Q_3$ are applied to a parallel-series converter $P_3$. An adder A combines the output bits of the two parallel-series converters. Clock pulses of clock-frequency $f_s$ are applied through a switch R to the two parallel-series converters. The clock pulses $f_s$ and the pulses for the switches R and S are derived from a pulse-generator (not shown), which is synchronized with the sample rate $f_s/q$ of the input signal. The time relationship between the pulses and signals is illustrated in FIG. 2.

In this figure the upper row $2_a$ represents a series of clock pulses at the rate $f_s$ that are applied to the switch R and the second row $2_b$ represents a series of clock pulses at the rate $f_s/q$ that are used to digitize the input signal. It may be apparent that 5 periods of the clock pulses of row $2_a$ correspond with 2 periods of the clock pulses of row $2_b$ and that consequently q=2,5. The row $2_c$ shows the 3-bit words generated by the quantizer $Q_3$. These words are generated at the same rate $f_s/q$ as the rate of the input signal and of the filter F. As will be shown afterwards, only half of these output words will be used to build the output signal. The unused output words of the quantizer $Q_3$ are drawn by dotted lines. These words are generated by $Q_3$ when its output is disconnected from the feedback paths to the low pass filter F.

The row $2_d$ shows the 2-bit words from quantizer $Q_2$, which also have the rate $f_s/q$. Again the dotted lines represent the unused words, i.e. the words generated by quantizer $Q_2$ when the quantizer output is disconnected from the feedback paths to the filter F. Both the used and the unused output words of $Q_3$ are stored in the 3-bit parallel-series converter $P_3$. The used words are then clocked out at the rate $f_s$ to the adder A. Similarly the used and unused output words of the quantizer $Q_2$ are stored in the 2-bit parallel-series converter and only the used words are clocked out at the rate $f_s$ to the adder A.

Row $2_f$ of FIG. 2 shows the switching signal controlling the switch S. When this signal is high, the output words of $Q_3$ are used to build the feedback for the filter F and when this signal is low the output words of $Q_2$ are used for this purpose. Row $2_g$ shows the signal that controls the switch R. When this signal is high three clock pulses of rate $f_s$ are applied to the 3-bit parallel-series converter $P_3$ to shift its content to the output O and when this signal is low two clock pulses are applied to the 2-bit parallel-series converter $P_2$ to shift its content to the output. Therefore, the used output words of the quantizers $Q_2$ and $Q_3$ are alternately serialized and applied to the output O of the converter at the rate $f_s$. The row $2_e$ shows the bits at the output O of the converter while it is also indicated from which words the bits are derived. It is seen from this row that that the bit rate at the output O is equal to $f_s$ and that alternately three bits originate from the quantizer $Q_3$ and two bits from the quantizer $Q_2$. Therewith the effective Rebic factor q of the converter is 2,5.

Other-bit quantizers may obtain other non-integer Rebic factors. Preferably, when the required q-factor is between the integers n and n+1, an n-bit quantizer and an n+1-bit quantizer are used because then the circuitry is simplest. It is not necessary that the bits in the output sequence originate alternately from the two quantizers. For instance, in case an effective Rebic factor q=2⅓ is required, one serialized output-word of a 3 bit quantizer may be followed by two serialized output-words of a 2-bit quantizer. This can be implemented by the arrangement as shown in FIG. 1 while only the switching signals for the switches R and S need to be modified. Instead of a fixed sequence of the switching of the output words of the quantizers, a random sequence may also fulfill the job.

The recursive bit-stream converter of FIG. 3 has a number of parts that are similar to those of FIG. 1 and these parts have the same reference numerals as in FIG. 1. In some cases it is desired that the sample rate of the output signal is equal to the sample rate of the input signal. Therefore an important difference with the converter of FIG. 1 is that the input signal of the converter of FIG. 3 has a sample rate $f_s$, i.e. a sample rate that is by the Rebic factor q higher than the input sample rate in the converter of FIG. 1. Consequently, all the parts of the converter of FIG. 3 have to be able to operate at this higher sample rate.

Instead of the two-position switches $S_a$, $S_b$, $S_c$ of FIG. 1 the converter of FIG. 3 has five-position switches $V_a$, $V_b$ and $V_c$. At the position 1 these switches respectively connect the outputs of the adders $B_0$, $B_1$ and $B_2$ to the feedback-inputs $I_a$, $I_b$ and $I_c$ of the filter F. At the position 4 the three switches connect the outputs of the adders $B_3$, $B_4$ and $B_5$ to the respective feedback-inputs. The positions 2, 3 and 5 of these switches are idle.

The parallel-series conversion of the quantizer-output words is performed for the quantizer $Q_2$ by single-bit shift registers $X_1$ and $X_2$ and for the quantizer $Q_3$ by single-bit shift registers $Y_1$, $Y_2$ and $Y_3$. A second five-position switch W connects respectively the outputs of the shift registers $X_1$, $X_2$, $Y_1$, $Y_2$ and $Y_3$ to the output O of the converter. The two five-position switches V and W switch synchronously at the rate $f_s$, be it with a phase shift so that when switch V is in the position 1 switch W is in the position 4.

The operation of the converter of FIG. 3 is clarified in FIG. 4. The first row of this figure shows a sequence of the clock pulses at the rate $f_s$ on which the entire converter of FIG. 3 operates. The vertical stripes in row 4b represent the 3-bit output words of the quantizer $Q_3$ and the vertical stripes of row 4c represent the 2-bit output words of quantizer $Q_2$. The dotted stripes thereof are the output words of $Q_2$ and $Q_3$ that are not used for the production of the output signal. Row 4d represents the output bits at the output O of the converter. It is also indicated in FIG. 4 from which of the words shown in rows 4b and 4c the bits of the output signal are derived. Row 4e shows the sequence of the positions of the five-position switch V and row 4f shows the sequence of the positions of the five-position switch W.

In position 1 of the switch V the two output bits of the quantizer $Q_2$ are stored in the two shift-register locations $X_1$a and $X_2$a Simultaneously the $3^{rd}$ bit of quantizer $Q_3$ is shifted from shift-register location $Y_3$b to location $Y_3$c and, because the switch W is in position 4, the $2^{nd}$ bit of quantizer $Q_3$ is read out from shift-register location $Y_2$b to the output O.

In position 2 of the switch V the two $Q_2$-bits in shift-register locations $X_1$a and $X_2$a are shifted to locations $X_1$b and $X_2$b respectively. Simultaneously, because the switch W is in the position 5, the $3^{rd}$ bit from quantizer $Q_3$ is read out from shift-register location $Y_3$c tp the output O.

In position 3 of the switch V (=position 1 of the switch W) the $1^{st}$ bit from $Q_2$ is read out from shift-register location $X_1$b to the output O and the $2^{nd}$ bit from $Q_2$ is shifted from location $X_2$b to $X_2$c.

In position 4 of the switch V (=position 2 of switch W) the three output bits of quantizer $Q_3$ are stored in the three shift-register locations $Y_1$a, $Y_2$a and $Y_3$a respectively. Simultaneously the $2^{nd}$ $Q_2$-bit is read out from shift-register location $X_2$c to the output.

And finally in position 5 of the switch V (=position 3 of switch W) the $1^{st}$ $Q_3$-bit in location $Y_1$a is read out to the output O and the $2^{nd}$ and $3^{rd}$ $Q_3$-bits are shifted from locations $Y_2$a and $Y_3$a to locations $Y_2$b and $Y_3$b respectively. Thereafter the cyclic sequence is repeated.

The invention claimed is:

1. A recursive bit-stream converter for converting a multi-bit digital input signal to a single bit digital output signal, said converter comprising, in a feedback loop, means (F) for low pass filtering said input signal and producing digital filtered words, quantizer means for quantizing said filtered words and means for applying the quantized filtered words through feedback means ($M_1$–$M_{10}$, $B_0$–$B_5$) to the low pass filtering means (F) and further comprising outside of said feedback loop means for parallel to series conversion of the quantized filtered words to produce the single bit digital output signal, characterized in that the quantizer means comprise at least two quantizers ($Q_2$, $Q_3$) of different bits whose output words are successively parallel to series converted ($P_2$, $P_3$) to produce the output signal (O) and synchronously therewith successively applied to said feedback means.

2. A recursive bit-stream converter as claimed in claim 1 characterized in that the quantizer means comprise two quantizers ($Q_2$, $Q_3$) and that the bit-number of one of these quantizers is one unity higher than the bit-number of the other of these quantizers.

3. A recursive bit-stream converter as claimed in claim 2 characterized in that the converter is intended for use in coders for producing Super Audio CD signals and that the quantizer means ($Q_2$, $Q_3$) comprise a 2-bit quantizer and a 3-bit quantizer, which are alternately operative in producing one serialized word in the output signal (O) of the converter.

4. A method for converting a multi-bit digital input signal to a single bit digital output signal in which said input signal is low pass filtered by low filter means (F) to digital filtered words which are quantized by quantizer means and the fed back by feed back means ($M_1$–$M_{10}$, $B_0$–$B_5$) to the low pass filter means, in which method further the quantized filtered words are converted by parallel to series conversion means to the single bit digital output signal, characterized in that the quantizer means comprise at least two quantizers ($Q_2$, $Q_3$) of different bits whose output words are successively parallel to series converted by the parallel to series conversion means ($P_2$, $P_3$) to the output signal (O) and synchronously therewith successively fed back to the low pass filter means.

* * * * *